US011375618B2

(12) United States Patent
Kramer et al.

(10) Patent No.: US 11,375,618 B2
(45) Date of Patent: *Jun. 28, 2022

(54) INTEGRATED ELECTRICAL COMPONENT WITHIN LAMINATE

(71) Applicant: THE DILLER CORPORATION, Cincinnati, OH (US)

(72) Inventors: Robert Jacob Kramer, Franklin, OH (US); Kevin Francis O'Brien, Cincinnati, OH (US)

(73) Assignee: THE DILLER CORPORATION, Cincinnati, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/595,299

(22) Filed: Oct. 7, 2019

(65) Prior Publication Data

US 2020/0037449 A1 Jan. 30, 2020

Related U.S. Application Data

(63) Continuation of application No. 15/731,076, filed on Apr. 14, 2017, now Pat. No. 10,440,828.

(51) Int. Cl.
*H05K 1/18* (2006.01)
*H05K 1/03* (2006.01)
(Continued)

(52) U.S. Cl.
CPC ............ *H05K 1/185* (2013.01); *B32B 3/266* (2013.01); *B32B 7/12* (2013.01); *B32B 29/002* (2013.01);
(Continued)

(58) Field of Classification Search
CPC ............ B32B 2250/26; B32B 2255/12; B32B 2255/205; B32B 2260/028;
(Continued)

(56) References Cited

U.S. PATENT DOCUMENTS 4,196,033 A * 4/1980 Arai .................... D06N 3/0097
156/196
5,248,843 A * 9/1993 Billings .................. A63H 5/00
84/609
(Continued)

FOREIGN PATENT DOCUMENTS

DE 102008062809 * 7/2010
EP 2613329 A1 7/2013
(Continued)

OTHER PUBLICATIONS

International Search Report and Written Opinion for corresponding International Application No. PCT/US2018/027481, dated Jul. 5, 2018.

*Primary Examiner* — Andargie M Aychillhum
(74) *Attorney, Agent, or Firm* — Marshall, Gerstein & Borun LLP

(57) ABSTRACT

A laminate having an integrated electrical component disposed within the laminate is disclosed. The laminate includes a first paper layer having at least first and second vias through the first paper layer; a first electrically-conductive layer, comprising an electrically-conductive material, disposed over a portion of the first paper layer; a second electrically-conductive layer, comprising the electrically-conductive material, disposed over another portion of the first paper layer; an electrical component disposed over the first and second electrically-conductive layers; and an insulating layer disposed over the electrical component. The first paper layer and the insulating layer encapsulate the first electrically-conductive layer, the second electrically-conductive layer, and the electrical component. The first and second vias are in electrical contact with the first electrically-conductive layer and a first terminal of the electrical component, and with the second electrically-conductive
(Continued)

layer and a second terminal of the electrical component, respectively.

19 Claims, 7 Drawing Sheets

(51) Int. Cl.

| | | |
|---|---|---|
| *H05K 1/11* | (2006.01) | |
| *H05K 1/09* | (2006.01) | |
| *H05K 3/40* | (2006.01) | |
| *H05K 3/46* | (2006.01) | |
| *H05K 3/28* | (2006.01) | |
| *B32B 29/00* | (2006.01) | |
| *B32B 3/26* | (2006.01) | |
| *B32B 7/12* | (2006.01) | |

(52) U.S. Cl.
CPC ......... *B32B 29/005* (2013.01); *H05K 1/0353* (2013.01); *H05K 1/0386* (2013.01); *H05K 1/092* (2013.01); *H05K 1/115* (2013.01); *H05K 3/28* (2013.01); *H05K 3/4038* (2013.01); *H05K 3/4644* (2013.01); *B32B 2250/26* (2013.01); *B32B 2255/12* (2013.01); *B32B 2255/205* (2013.01); *B32B 2260/028* (2013.01); *B32B 2260/046* (2013.01); *B32B 2307/202* (2013.01); *B32B 2307/206* (2013.01); *B32B 2307/4023* (2013.01); *B32B 2451/00* (2013.01); *B32B 2457/00* (2013.01); *B32B 2457/08* (2013.01); *H05K 2201/0215* (2013.01); *H05K 2201/10015* (2013.01); *H05K 2201/10022* (2013.01); *H05K 2201/10166* (2013.01)

(58) Field of Classification Search
CPC ........ B32B 2260/046; B32B 2307/202; B32B 2307/206; B32B 2307/4023; B32B 2451/00; B32B 2457/00; B32B 2457/08; B32B 29/002; B32B 29/005; B32B 3/266; B32B 7/12; H05K 1/0353; H05K 1/0386; H05K 1/092; H05K 1/115; H05K 1/185; H05K 2201/0215; H05K 2201/10015; H05K 2201/10022; H05K 2201/10166; H05K 3/28; H05K 3/4038; H05K 3/4644
USPC .......................................................... 361/762
See application file for complete search history.

(56) References Cited

U.S. PATENT DOCUMENTS

| | | | | |
|---|---|---|---|---|
| 5,362,557 | A | * | 11/1994 | Albrinck ................ B32B 27/04 428/323 |
| 6,180,215 | B1 | * | 1/2001 | Sprietsma ............... B32B 27/04 428/209 |
| 6,468,677 | B1 | * | 10/2002 | Benton .................. B32B 27/04 156/67 |
| 8,779,298 | B2 | | 7/2014 | Asterland |
| 10,118,547 | B2 | * | 11/2018 | Duce ........................ F21S 43/00 |
| 10,440,828 | B2 | * | 10/2019 | Kramer .................. B32B 3/266 |
| 2002/0023777 | A1 | | 2/2002 | Ochi et al. |
| 2004/0224135 | A1 | * | 11/2004 | Krebs .................. G06K 7/0008 428/195.1 |
| 2006/0127673 | A1 | * | 6/2006 | Aho ........................ B32B 29/00 428/411.1 |
| 2007/0006452 | A1 | | 1/2007 | Egitto et al. |
| 2007/0102804 | A1 | | 5/2007 | Nakamura et al. |
| 2011/0101366 | A1 | * | 5/2011 | Dozen .................... B32B 29/00 257/66 |
| 2014/0210279 | A1 | | 7/2014 | Van Herpen et al. |
| 2015/0048687 | A1 | | 2/2015 | Wang |
| 2015/0223320 | A1 | * | 8/2015 | Gerhau er ............ H01L 21/486 29/832 |
| 2015/0296612 | A1 | | 10/2015 | Gumbiowski et al. |
| 2016/0104566 | A1 | | 4/2016 | O'Brien et al. |
| 2016/0351486 | A1 | * | 12/2016 | Jung ....................... H01L 24/25 |

FOREIGN PATENT DOCUMENTS

| | | |
|---|---|---|
| WO | WO-99/38686 A1 | 8/1999 |
| WO | WO-2015/060781 A1 | 4/2015 |
| WO | WO-201 7/111590 A1 | 6/2017 |
| WO | WO-2017/138812 A1 | 8/2017 |
| WO | WO-2017/142412 A1 | 8/2017 |

* cited by examiner

INTEGRATED ELECTRICAL COMPONENT WITHIN LAMINATE

CROSS REFERENCE TO RELATED APPLICATION

This application is a continuation of U.S. patent application Ser. No. 15/731,076, filed Apr. 14, 2017, which is incorporated herein by reference in its entirety and made a part hereof.

BACKGROUND OF THE INVENTION

Decorative laminates have been used as surfacing materials for many years, in both commercial and residential applications, where pleasing aesthetic effects in conjunction with desired functional behavior (such as superior wear, heat and stain resistance, cleanability and cost) are preferred. Typical applications have historically included furniture, kitchen countertops, table tops, store fixtures, bathroom vanity tops, cabinets, wall paneling, office partitions, and the like.

Laminates are useful as surfacing materials, including as decorative surfaces, in many situations due to their combination of desirable qualities (e.g., superior wear, heat and stain resistance, cleanability, and cost). Laminate surfaces are composed of discrete layers, such as layers of resin-impregnated kraft paper that are pressed to form the laminate. One conventional decorative laminate is made by stacking three sheets of kraft paper (e.g., three sheets of phenol-formaldehyde resin-impregnated kraft paper), dry decorative paper (e.g., a print sheet), and a sheet of treated overlay paper (e.g., melamine-formaldehyde resin-impregnated tissue paper or acrylic resin-impregnated tissue paper), one on top of another and then bonded together with heat and pressure.

A high-pressure laminate process (HPL) is an irreversible thermal process wherein resin-impregnated sheets of kraft paper undergo a simultaneous pressing and heating process at relatively high levels of heat and pressure, such as temperatures greater than or equal to 125° C. and at least 5 mega Pascals (MPa) of pressure, typically for a press cycle of 30-50 minutes. An HPL process contrasts with low pressure laminate processes (LPL) that is conducted at pressures of less than 5.0 MPa, typically between 2-3 MPa.

SUMMARY OF THE DISCLOSURE

This summary is provided to introduce a selection of concepts in a simplified form that are further described in the Detailed Descriptions. This summary is not intended to identify key features or essential features of the claimed subject matter, nor is it intended to be used to limit the scope of the claimed subject matter.

A laminate with an integrated electrical component (e.g., a capacitor, resistor, transistor, integrated circuit, etc.) embedded within the laminate comprising a first paper layer having at least first and second vias through the first paper layer, a first electrically-conductive layer comprising an electrically-conductive material, the first electrically-conductive layer being disposed over a portion of the first paper layer, a second electrically-conductive layer comprising the electrically-conductive material, the second electrically-conductive layer being disposed over another portion of the first paper layer, an electrical component disposed over the first and second electrically-conductive layers, the electrical component having at least first and second electrical terminals, an insulating layer disposed over the electrical component, wherein the first paper layer and the insulating layer encapsulate the first electrically-conductive layer, the second electrically-conductive layer, and the electrical component within the laminate, wherein the first and second vias include an electrically-conductive material therein, the first electrically-conductive layer is electrically coupled to the first via and the first electrical terminal, the second electrically-conductive layer is electrically coupled to the second via and the second electrical terminal is disclosed.

A method for manufacturing a laminate with an integrated electrical component (e.g., a capacitor, resistor, transistor, integrated circuit, etc.) embedded within the laminate comprising forming at least first and second via holes through a first paper layer, disposing a first electrically-conductive layer over a portion of the first paper layer, wherein the first electrically-conductive layer comprises an electrically-conductive material, disposing a second electrically-conductive layer over another portion of the first paper layer, wherein the second electrically-conductive layer comprises an electrically-conductive material, disposing an electrical component over the first and second electrically-conductive layers, the electrical component having at least first and second electrical terminals, filling the first and second via holes with an electrically-conductive material, disposing an insulating layer over the electrical component, and compressing the first paper layer, first and second electrically-conductive layers, the electrical component, and the insulating layer, according to a lamination process, thereby forming first and second vias in the first and second via holes, the first via electrically coupling the first electrically-conductive layer to the first electrical terminal, and the second electrically-conductive layer to the second electrical terminal, and encapsulating the electrical component within the laminate is disclosed.

DETAILED DESCRIPTION

Figure 1:
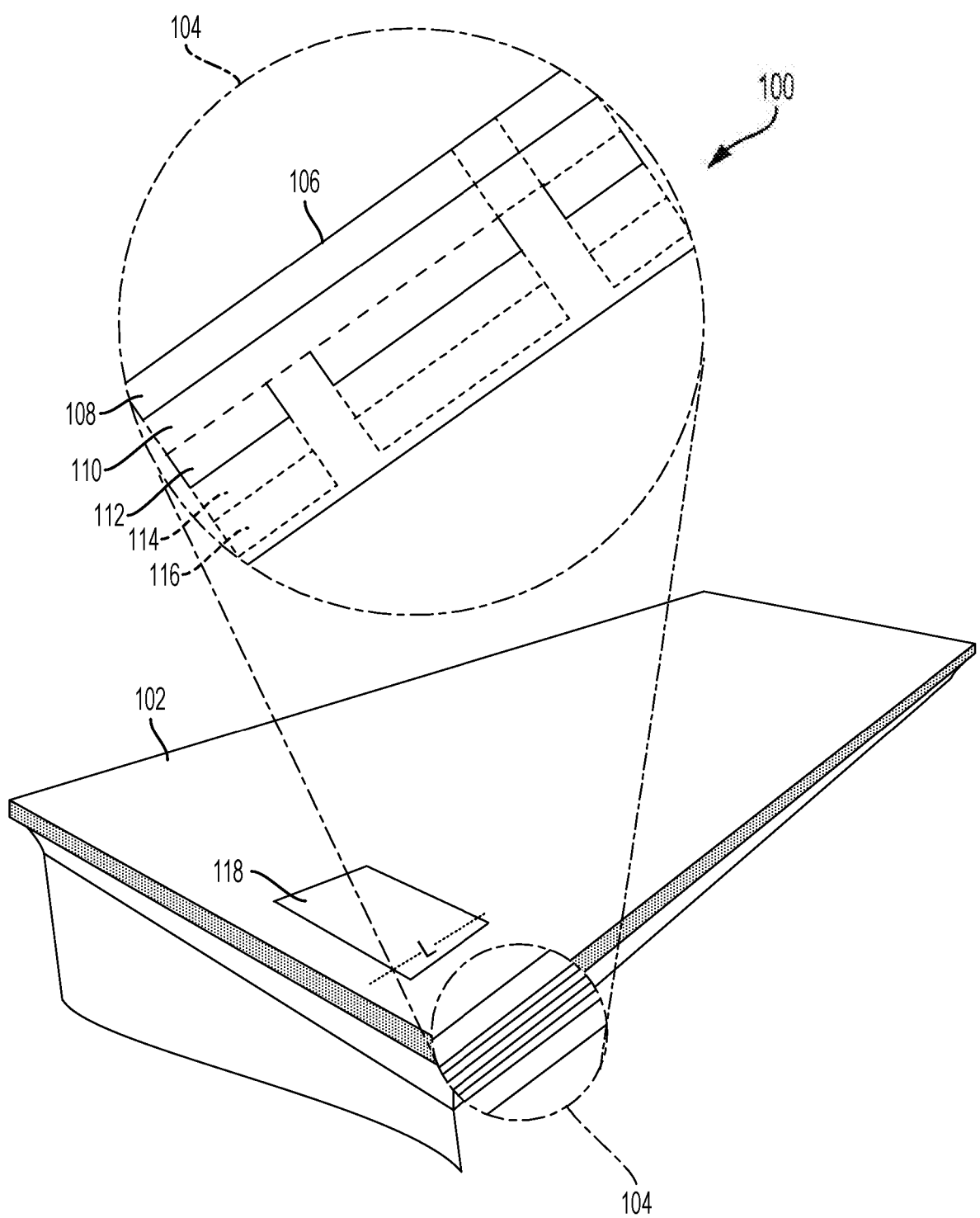
FIG. 1 is a schematic diagram of an example of a laminate surfacing material integrated into a countertop with an electroluminescent element disposed on multiple layers within the laminate.

A laminate with an integrated electrical component (e.g., a capacitor, resistor, transistor, integrated circuit, etc.) embedded within the laminate comprising a first paper layer having at least first and second vias through the first paper layer, a first electrically-conductive layer comprising an electrically-conductive material, the first electrically-conductive layer being disposed over a portion of the first paper layer, a second electrically-conductive layer comprising the electrically-conductive material, the second electrically-conductive layer being disposed over another portion of the first paper layer, an electrical component disposed over the first and second electrically-conductive layers, the electrical component having at least first and second electrical terminals, and an insulating layer disposed over the electrical component is disclosed. In embodiments, the first paper layer and the insulating layer may encapsulate the first electrically-conductive layer, the second electrically-conductive layer, and the electrical component within the laminate. The first and second vias include the electrically-conductive material therein. The first electrically-conductive layer may be electrically coupled to the first via and the first electrical terminal, and the second electrically-conductive layer may be electrically coupled to the second via and the second electrical terminal, the first via making electrical contact with the first electrically-conductive layer and the first electrical terminal, and the second via making electrical contact with the second electrically-conductive layer and the second electrical terminal. In certain embodiments, the insulating layer may comprise a decorative layer. For example, the insulating layer may comprise a resin-impregnated decorative layer. As another example, the insulating layer may comprise a treated overlay paper layer. When the insulating layer comprises a treated overlay paper layer, the laminate may further comprise a dry or untreated decorative paper (also known as a print sheet) between the treated overlay paper layer and the second paper layer. Of course, the laminate may also comprise glue film layers, for example when untreated kraft paper layers are included as further described below.

Generally, as used herein, a "decorative layer" is a visible outer layer in the (final, assembled) laminate. A decorative layer may have decorative colors and/or designs. Of course, as mentioned above, an overlay layer may be disposed above a decorative layer provided that the decorative layer is at least partially visible through the overlay layer.

A laminate surfacing material, disposed on different paper layers (e.g., resin-impregnated paper layers), which includes an embedded electrical component, has particularly useful characteristics, including: the ability to add more electrical components in a space-efficient manner by providing additional electrical components and electrically-conductive materials on different layers of the laminate; favorable heat-dissipation properties due to the lack of insulating air inside the laminate and optional use of fillers with high heat transfer coefficients (e.g., ceramics such as aluminum nitride, aluminum oxide, boron nitride, and combinations thereof) in the resin formulations used to prepare the resin-impregnated paper layers such that heat transfer away from the electrical component is enhanced, effectively turning the laminate surfacing material into an efficient heat sink and facilitating the utilization of the electrical element; unexpected and surprising electrical conductivity of the electrically-conductive material used to provide the electrical component even after undergoing an HPL process; greatly increased durability, prevention of whisker formation, making the circuitry water-proof, dust/sand resistance, moderate flexibility, and the ability to be integrated into almost any surface (e.g., countertop, wall, piece of furniture, door, window frame, interior of a vehicle, etc.). The resin-impregnated paper layers also provide a durable enclosure for the electrical component.

The electrical component may be disposed over a first electrically-conductive layer and a second electrically-conductive layer. The first and second electrically-conductive layers each comprise electrically-conductive material (e.g., electrically-conductive ink) disposed onto a first paper layer (e.g., kraft paper) having at least first and second via holes cut through the paper layer for electrically coupling the electrical component by filling the first and second via holes with an electrically-conductive material. Disposing (e.g., printing) the electrically-conductive material onto two different portions of a first paper layer and other paper layers that may be included in the laminate allows the paper fibers to act as reinforcements for the electrical component, preventing breakage of the electrical component due to shrinkage or expansion due to various environmental conditions. The layers of the laminate are stacked, encapsulating the electrical component between discrete paper layers using a lamination process. While low pressure lamination may be used to prepare laminates according to the disclosure, a high pressure lamination process including a re-cooling stage (referred to herein as "high pressure lamination") is preferred.

As described herein, the electrical component is "encapsulated" or substantially protected by providing the electrically-conductive material for the electrical component on a first paper layer and disposing an insulating layer above the electrically-conductive material such that the electrical element is at least partially protected or shielded from ambient atmosphere by the overlying layer.

It has been found that when laminates are exposed to the heat and pressure in the high pressure lamination process, the risk of breaking or delamination of the electrical component is greatly reduced. The high pressure lamination process allows the electrical component to electrically couple with electrically-conductive tracks having improved track densification, which achieves surprisingly higher conductivities than through other conventional manufacturing techniques. The high pressure lamination process allows for accurate control of temperature and pressure (e.g., heating and cooling cycles) in order to control the rate of dimensional change of layers and surprisingly leads to enhanced electrical conductivity of the electrically-conductive material used in the laminate process.

Various embodiments of the present disclosure are methods for preparing such laminates with the electrical component embedded within the laminate. The methods include forming at least first and second via holes through a first paper layer, disposing (e.g., inkjet printing, flexographic printing, gravure printing, screen printing, extrusion printing, and the like) a first electrically-conductive layer (e.g., electrically-conductive material) over a portion of the first paper layer, disposing (e.g., inkjet printing, gravure printing, screen printing) a second electrically-conductive layer (e.g., electrically-conductive material) over another portion of the first paper layer, disposing an electrical component over the first and second electrically-conductive layers, filling the first and second vias with electrically-conductive material, disposing an insulating layer over the electrical component, and compressing the first paper layer, first and second electrically-conductive layers, the electrical component, the insulating layer, and the filled first and second vias according to a lamination process, thereby encapsulating the electrical component within the laminate. The first and second vias may be provided at selected locations with electrically-conductive material such that the first electrically-conductive layer may be electrically coupled to the first via and a first electrical terminal of the electrical component, the second electrically-conductive layer may be electrically coupled to the second via and a second electrical terminal of the electrical component, the first via making electrical contact with the first electrically-conductive layer and the first electrical terminal, and the second via making electrical contact with the second electrically-conductive layer and the second electrical terminal. Factors in determining the selected locations may include efficient layout design, avoiding shorting the electrical component, etc. The layers of the laminate may be stacked, encapsulating the electrical component and electrically-conductive material between the first paper layer and the insulating layer by subjecting the laminate to the high pressure lamination process, which surprisingly results in advantageously enhanced densification of the electrical component, electrically-conductive material and excellent conductivity. It should be noted that the same electrically-conductive material may be used for the electrical component and the vias, but different electrically-conductive materials may also be used.

In one preferred embodiment, a method of making a laminated surface material comprises providing at least an first untreated kraft paper layer, a glue film layer, and an insulating layer; disposing first and second electrically-conductive layers over different portions of a first untreated kraft paper layer; disposing an electrical component over the first and second electrically-conductive layers; arranging a stack comprising at least the first untreated kraft paper layer, the glue film layer, and the insulating layer such that the insulating layer is disposed above the glue film layer; compressing the stack according to a lamination process. Typically, the stack includes an additional glue film layer disposed below the first untreated kraft paper layer so as to allow a sufficient amount of resin to saturate the laminate during a lamination process, in order to provide sufficient mechanical strength to the final formed laminate. By providing the first and second electrically-conductive layers on untreated kraft paper, significantly improved alignment of holes formed in the stack can be achieved than when the first and second electrically-conductive layers are disposed on resin-impregnated paper layers. A glue film layer as used herein is a layer having a sufficient amount of thermoset resin to saturate an adjacent untreated paper layer (e.g., a decorative layer or a kraft paper layer). Typically, a glue film layer will comprise a paper layer having between 30-80 percent by weight of a thermoset resin. Preferably, the thermoset resin of the glue film comprises phenol-formaldehyde resin.

Thus, a preferred laminated surface material comprises a stack comprising at least an first untreated kraft paper layer, a glue film layer, and an insulating layer such that the insulating layer is disposed above the glue film layer; first and second electrically-conductive layers disposed over different portions of the first untreated kraft paper layer; an electrical component disposed over the first and second electrically-conductive layers. Typically, the stack includes an additional glue film layer disposed below the first untreated kraft paper layer so as to allow a sufficient amount of resin to saturate the laminate during a lamination process, in order to provide sufficient mechanical strength to the final formed laminate.

Electrically-conductive materials suitable for use in accordance with the various embodiments of the present disclosure include any material which can be disposed upon the first paper layer and other paper layers that may be included as part of the laminate, such as resin-impregnated paper, and which may be electrically electrically-conductive. In some embodiments, the composition of the electrically-conductive material includes: (i) a particulate, electrically-conductive material; (ii) a binder; and optionally (iii) a microcrystalline cellulose component.

The particulate, electrically-conductive material may include any one of metals, alloys, electrically-conductive carbons (e.g., electrically-conductive allotropes of carbon, graphites), electrically-conductive polymers (e.g., polypyrrole), electrically-conductive metallized polymers (e.g., metallized polyethylene terephthalates), and combinations thereof. In a preferred aspect, the particulate electrically-conductive material comprises silver and/or silver alloys. Electrically-conductive ink compositions which may be disposed to provide electrically-conductive material on a paper layer and are thus suitable for use in various embodiments of the present disclosure typically include particles comprising metal, metal alloys, electrically-conductive carbon, or other electrically-conductive materials such as polymers, in a carrier medium which may include other polymers, solvents and additives. Various known methodologies such as inkjet printing, screen printing, flexographic printing, gravure printing, or extrusion printing may be used to dispose the electrically-conductive ink compositions on the substrate.

One embodiment of an electrically-conductive ink composition suitable for providing the particulate electrically-conductive material is an electrically-conductive ink composition comprising: (i) a particulate, electrically-conductive material; (ii) a carrier liquid; (iii) a polymer binder; and (iv) a microcrystalline cellulose component. Another embodiment of an electrically-conductive ink composition suitable for providing the particulate electrically-conductive material is an electrically-conductive ink composition comprising: (i) a particulate, electrically-conductive material; (ii) a carrier liquid; (iii) a polymer binder; and (iv) a microcrystalline cellulose component; wherein the particulate, electrically-conductive material comprises a component selected from the group consisting of silver and silver alloys; and wherein the microcrystalline cellulose component is present in an amount of from about 0.05% to about 10% by weight based on the composition and has an average particle size of from about 20 to about 100 µm. In certain embodiments of the present disclosure, the microcrystalline cellulose component may include two or more microcrystalline celluloses having different average particle sizes. As noted above, disposing methods such as inkjet printing, flexographic printing, gravure printing, screen printing, and extrusion printing may dispose the electrically-conductive material onto the paper layers, such as kraft paper and overlay paper, but depending on the type of paper, the electrically-conductive material may or may not penetrate completely through the paper.

If kraft paper (i.e., unbleached paper that is between 50-400 GSM (or g/m$^2$)) is used, and an electrically-conductive ink composition is disposed thereon, the electrically-conductive material may penetrate halfway through the kraft paper, whereas if overlay paper (i.e., bleached paper that is between 10-50 GSM) having less than half the basis weight of kraft paper is used, and an electrically-conductive ink composition is disposed thereon, the electrically-conductive material will typically penetrate completely through the overlay paper. As such, in order to couple electrically-conductive material provided on different layers of kraft paper together, apertures can be cut at least halfway through the kraft paper, so that electrically-conductive material disposed over a top surface of the kraft paper penetrates halfway through the first kraft paper to form a via and establish an electrical connection with a same type or different type electrically-conductive material provided on a top surface of a second kraft paper layer underlying the first kraft paper layer. Because disposed electrically-conductive material may penetrate completely through overlay paper, it is not necessary to cut apertures in the overlay paper to form a via and couple the electrically-conductive material disposed on a top surface of a first overlay paper layer to a same type or different type electrically-conductive material disposed on a top surface of a second paper layer disposed thereunder. Once disposed, the electrically-conductive material may be subject to the high pressure lamination process involving pressing at elevated temperature and pressure.

The electrically-conductive material described above may be disposed in a pattern over the first paper layer and other paper layers in various embodiments of the present disclosure. Suitable patterns include, but are not limited to: continuous, meandering lines, spirals, circles, ovals, polyhedral shapes such as rectangles, squares, hexagons, octagons, spirangles, sawtooth waves, and combinations thereof. Preferably, electrically-conductive materials may be disposed in patterns which provide a relatively large amount of electrically-conductive material on the paper layer while maintaining a gap between adjacent portions of the electrically-conductive pathway. The cross-sectional area of any linear portion of an electrically-conductive material may be important in circumstances where electrical resistance is to be minimized as the total electrical resistance of any electrically-conductive track is the product of the specific resistance per square (related to cross-sectional area) and the track length. In other words, as understood by those skilled in the art, greater cross-sectional areas lead to lower overall track resistances which lead to lower resistive heating for similar electric current levels.

It may be preferable to optimize the relationship between track vertical thickness, the cross sectional area and the pitch (i.e., the distance between two adjacent linear portions or tracks of the electrically-conductive material disposed on a paper layer) which should be controlled to be as small as possible while ensuring that the two adjacent linear portions do not touch. It is also important to note that the pressure involved in the compression steps of the high pressure lamination process reduces the vertical thickness of the electrically-conductive track. The overall effect on total electrical resistance may vary as the compression may increase specific resistance of the electrically-conductive material by decreasing the cross-sectional area, while also increasing electrically-conductive contact between electrically-conductive particles within the electrically-conductive materials, thus decreasing resistance. Thus, various factors affect overall resistance. Preferably one or more such factors are considered in efforts to reduce overall resistance, and thus, heat generation.

The laminate in accordance with the various embodiments of the present disclosure may include one or more electrical contact pads which allow an electrical connection to be established to a via from the exterior of the laminate. In various embodiments wherein the laminate includes same or different electrically-conductive materials connected together, as described herein, the laminate may include an electrical contact pad coupled to a via providing a site for making an electrical connection to a first terminus of the first electrically-conductive material, and a second electrical contact pad coupled to a second via providing a site for making an electrical connection to the second terminus of the second electrically-conductive material. The laminate may further be coupled to a component or components connected to the electrical contact pads on the exterior of the laminate which component(s) are configured to accept AC, or pulsed DC, voltage input from an electrical source such that the electrically-conductive material(s) are provided with a current. Such components may include, but are not limited to various receptacles for AC and DC plugs, and terminal boxes or the like for hard-wiring AC or DC inputs. Electrical contact with the vias may also be established by coupling any electrically-conductive material to the electrical contact pads using various structures including but not limited to metal tabs, screws, prongs, cylindrical receptacles, spring-loaded pins, etc. Additionally, methods of establishing permanent electrical contact can be established by affixing an external component or conductor to the electrical contact pads by soldering or the use of conductive adhesives.

A laminate's paper layers may be impregnated with resin such that the paper layers, when stacked and compressed in the lamination process, can be cured or cross-linked. The resin can be a thermoset resin such that the paper layers in a stacked relationship can be compressed and heated to cure the thermoset resin. Specific suitable resins for use in the various embodiments of the present disclosure may differ depending on whether the resin-impregnated paper layer is an outer protective layer (e.g., an insulating layer), or an interior core layer (e.g., a treated kraft paper layer), or a base layer of the laminate surfacing material (e.g., a treated kraft paper layer). Generally, resin-impregnated paper layers are impregnated with any suitable thermoset resin including, but not limited to, acrylics, polyesters, polyurethanes, phenolics, phenol-formaldehydes, urea-formaldehydes, aminoplastics, melamines, melamine formaldehydes, diallyl-phthalates, epoxides, polyimides, cyanates, and polycyanurates, or copolymers, terpolymers or combinations thereof. Phenol-formaldehydes are generally preferred for impregnating kraft paper and acrylics or melamine-formaldehydes are generally preferred for impregnating overlay paper. As used in this disclosure, an insulating layer may be a translucent layer. A translucent layer means any layer that permits at least some light to pass there through. In other words, layers that are partially opaque are included as translucent layers.

In some implementations, resin-impregnated paper layers which are core layers are impregnated with a phenolic and/or epoxy resin, such as, for example, a phenolic-formaldehyde resin. Impregnating paper layers with a resin can be carried out in any suitable manner sufficient to apply a controlled quantity of resin to the paper, including but not limited to, screen printing, rotary screen printing, dip and squeeze, dip and scrape, reverse roll-coating, Meyer bar, curtain coating, slot-dye and gravure roller. The weight percentage of resin applied, relative to the weight of the paper layer as measured on an oven dried basis, may be in the range of about 5 to 75%, with a preferred resin content percent (determined relative to final weight) of about 15-45%. As the resins used in the impregnating step are normally aqueous or solvent based solutions, it is common in the laminating process to include a paper drying stage to reduce the paper solvent loading. In the various embodiments of the present disclosure, the weight percent level of residual solvent in the impregnated paper may be 2.5-15% with a typical level of about 5%. As used herein, cured can refer to both curing of a thermoset resin in the sense of its irreversible setting, or the crosslinking of other polymers with a separate cross-linker or by various forms of energy, or any means of fixing the resin when the laminate surfacing material is in its compressed form such that the electrically-conductive materials are encapsulated and will remain so during normal operation.

Suitable papers which may be used in resin-impregnated paper layers in accordance with the various embodiments of the present disclosure include but are not limited to: cellulose fiber, synthetic woven or non-woven fiber, or/and microfiber or/and nanofiber, mixtures of cellulose or/and synthetic fiber based papers or/and mineral fiber based papers or/and glass fiber based papers, coated or non-coated, pre-impregnated or non pre-impregnated that could be generally used for the production of laminates. In various embodiments of the present disclosure, paper suitable for use in resin-impregnated paper layers has at least one of the following properties: a minimum wet strength in the machine direction of 1400 cN/30 mm in accordance with the test method of the International Standard DIN ISO 3781, a Klemm absorbency range (capillary rise) in the machine direction of 30 to 90 mm/10 min in accordance with the test method of the International Standard DIN ISO 8787 with a preferred absorbency of 45 mm/10 min, Ash content 0 to 50% depending of the intrinsic nature of the paper used in accordance with the test method of the International Standard Din ISO 2144, a basis weight range of 10 to 400 GSM at moisture content range of 2 to 8% in accordance with the test method of the International Standard DIN ISO 536, a pH (on hot extract) between about 4 to 9 in accordance with the test method of the International Standard DIN ISO 6588. In various embodiments of the present invention, papers comprising at least a portion of recycled materials may be used.

In various preferred embodiments of methods of manufacturing surfacing materials in accordance with the present disclosure, the high pressure lamination process may be employed. In accordance with such various preferred embodiments, the multiple layers, including both paper layers and layers of the electrical component according to any of the previously described embodiments are positioned in a stacked relationship between two pressing plates. In such a high pressure lamination process, the plates are then pressed to a specific pressure of at least 5 MPa. The temperature is then raised in excess of 125° C., typically to about 140° C. The plates are then held at the elevated pressure and temperature for a period of time suitable for curing the resin. The temperature may then be lowered to 40° C., while maintaining the elevated pressure. The typical cycle time under pressure is between about 25 and about 50 minutes. Upon achieving a temperature of 40° C., the pressure on the plates may then be reduced to zero gauge pressure. While it is important to take care in ensuring that the stacked layers are aligned where a conductive connection between adjacent electrically-conductive materials through an aperture in an intervening layer is to be established, the layers need not otherwise be placed in perfect edge to edge alignment, as a post-pressing trimming may be carried out to shape the final surfacing material.

While resin-impregnated layers are typically used to prepare the laminates comprising an electrical element disposed on discrete layers of the laminate according to the disclosure, alternatively, paper layers having pressure-sensitive adhesives thereon can be compressed with the pressure-sensitive adhesives in a facing relationship to form a comparable laminate structure. In such a process, a mask can be applied at any locations where vias are desired in the final laminate product to facilitate via formation, similar to the procedure described herein with reference to FIG. 3.

FIG. 1 is a schematic diagram of an example of electrically functional system 100 including a laminate surfacing material 106 with an embedded electrical component on multiple layers integrated into a countertop 102. Other types of surfaces may also be covered with the laminate surfacing material 106 (e.g., wall, door, window, piece of furniture, interior of a vehicle, etc.). The laminate surfacing material 106 may include the electrically-conductive material described above disposed as electrically electrically-conductive tracks to electrically couple with the embedded electrical component within the laminate surfacing material 106. In an implementation, electrically-conductive material may not be disposed throughout the entire area covered by the laminate surfacing material (e.g., the entire countertop 102), but rather are located in only a portion of the laminate surfacing material, such as in a marked designated area 118.

Bubble 104 illustrates a cross-section view of an example laminate including the electrical component disposed on different layers of the laminate. In an implementation, electrically-conductive material (e.g., electrically-conductive ink) is disposed in the shape of electrically-conductive plates on paper layers of the substrate. Throughout this disclosure, references to electrically-conductive material or ink should be understood to include the electrically-conductive material or ink itself in addition to electrically-conductive particles left behind after the electrically-conductive material or ink has dried.

Several layers forming the laminate surfacing material to house the electrical component are generally illustrated in bubble 104. In the cross-section view of bubble 104, paper layer 112, optional additional paper layers 114, 116, optional decorative paper layer 110, and insulating layer 108 are visible along the cross-section. Paper layers 112-116 each illustrate at least first and second via holes through each layer. In an implementation, electrically-conductive material may be disposed on one or more layers 112-116 constituting the laminate surfacing material 106. It should be understood that throughout this application via holes are alternatively referred to as vias once conductive material is included therein and a lamination process that establishes electrical contact between electrically conductive elements is performed. In such a cross-section view, an integrated electrical component embedded in layers 112-116 of the laminate surfacing material may extend linearly along the line L or may be in a direction perpendicular to the line L, in which case the layers of the electrically-conductive material or electrical component would appear shorter in the cross-section view because only the width of the electrically-conductive track, and not the length, would be visible.

In use, the surface 102 may be equipped with an electronic device, such as a power supply to provide AC, or pulsed DC, voltage such that the electrically-conductive material and the integrated electronic component are provided with a current. The electronic device may be electrically connected to the electrically-conductive material(s) disposed in layers 112-116 or the integrated electronic component to provide the voltage. In at least one implementation, the electronic device may be physically enclosed in a structure beneath surface 102 and user interface controls are displayed to the user via surface 102 (e.g., LED lights embedded in surface 102, a control panel installed in surface 102, etc.).

Figure 2:
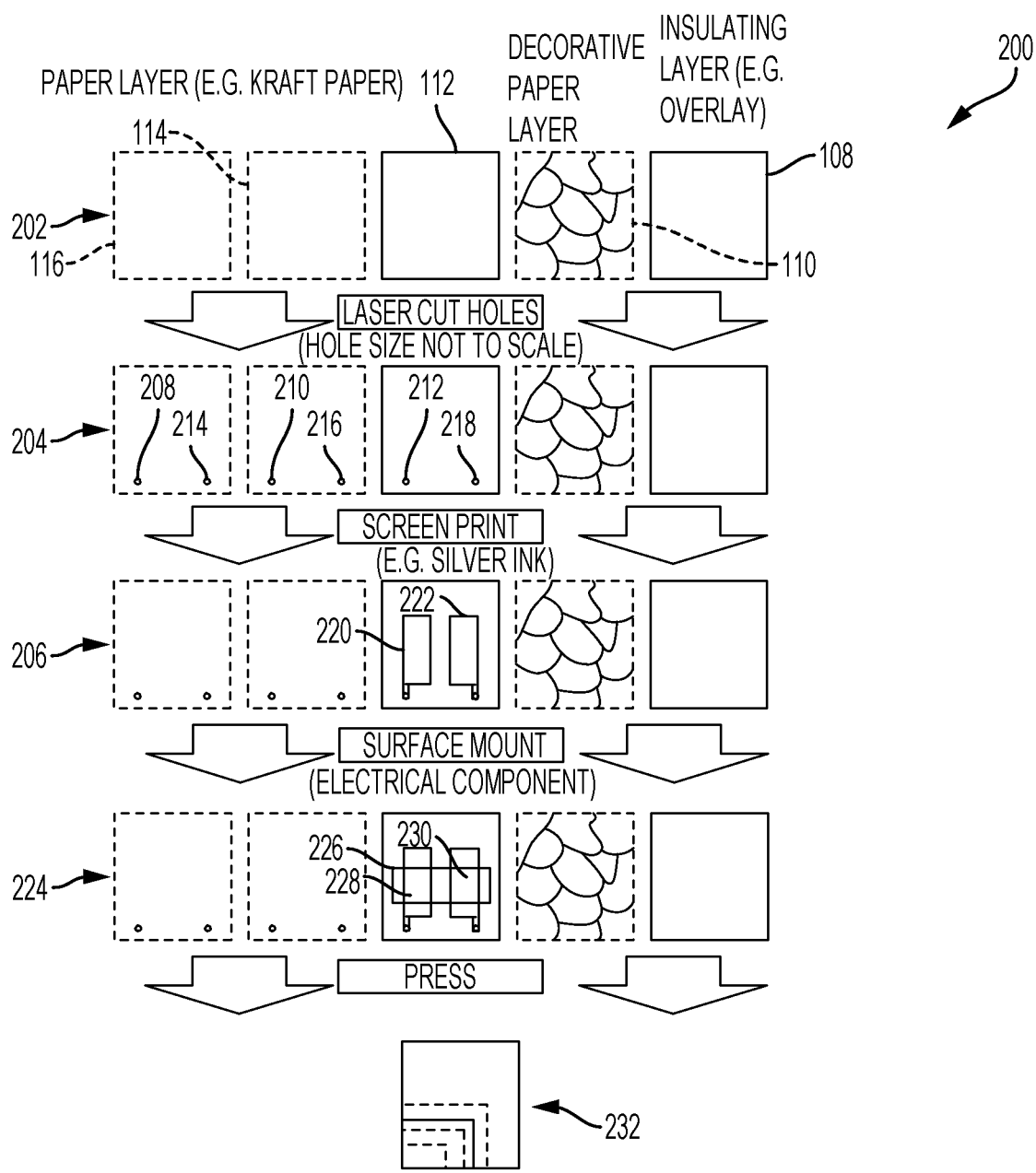
FIG. 2 shows an example of a laminate having an integrated electrical component within the laminate.

FIG. 2 shows an example of laminate surfacing material 106 having an integrated electrical component disposed within the laminate, as shown in laminate 200. Specifically, as shown in row 202, laminate 200 includes a paper layer 112 (e.g., kraft paper) and an insulating layer 108, as described in FIG. 1, between which an electrically-conductive layer (e.g., a first electrically-conductive layer, a second electrically-conductive layer) and electrical component will be disposed. The paper layer 112 may be impregnated with resin, such as phenolic resin. The insulating layer 108 may be untreated (e.g., tissue paper or any suitable paper not treated with melamine resin), treated overlay (e.g., paper treated with melamine resin), clear plastic film, glass, film provided on a decorative paper layer, or two or more of the aforementioned stacked together. The first and second electrically-conductive layers may be disposed by various methodologies, such as inkjet printing, screen printing, flexographic or gravure printing, extrusion printing, and three-dimensional printing. The laminate 200 may also include additional paper layers 114, 116 (e.g., kraft paper) and a decorative paper layer 110 (e.g., print sheet) as needed. The additional paper layers 114, 116 may be impregnated with resin, such as phenolic resin, and the decorative paper layer 110 may be untreated, and thus dry.

As shown in row 204, any one or more of the paper layers 112-114 may include a hole or via that may be formed or cut through the entire paper layer. For example, paper layer 112 includes via holes 212, 218. If the laminate 200 requires additional paper layers, additional paper layers 114, 116 include via holes 210, 216 and via holes 208, 214, respectively. The via holes described may be formed, cut through, or punched through, such as by a mechanical device or a laser, such that upon stacking paper layers on top of each other, the vias traverse each other. For example, via holes 208, 210, and 212 are vertically aligned with each other and vias 214, 216, and 218 are vertically aligned with each other when paper layers 112-116 in row 204 are stacked on top of each other. As such, vias of one paper layer may be vertically aligned with vias of another paper layer.

As shown in row 206, an electrically-conductive material may be disposed over a portion of paper layer 112 to form a first electrically-conductive layer 220. Similarly, the electrically-conductive material may be disposed over another portion of paper layer 112 to form a second electrically-conductive layer 222. In various embodiments of the present disclosure, one or more electrically-conductive materials may be disposed on either side or both of one or more paper layers. The electrically-conductive materials may be disposed in any shape, size, and may even form an outline of an aesthetic design. Electrically-conductive materials suitable for use in accordance with the various embodiments of the laminate 200 include any material which can be disposed upon paper, particularly resin-impregnated paper, and which may be electrically electrically-conductive. Suitable electrically-conductive materials include metals, alloys, and electrically-conductive inks. Electrically-conductive inks are commercially available from a number of sources and can be prepared using a number of known methods. Particularly preferred electrically-conductive inks suitable for use in various preferred embodiments of the present disclosure include silver and/or electrically-conductive carbon particles.

As shown in row 224, an electrical component 226 may be disposed (e.g., disposed) over the first electrically-conductive layer 220 and the second electrically-conductive layer 222. Specifically, a first terminal 228 of the electrical component 226 may be electrically coupled to the first electrically-conductive layer 220, and a second terminal 230 of the electrical component 226 may be electrically coupled to the second electrically-conductive layer 222. By filling the via holes 212, 218 with the electrically-conductive material, the first electrically-conductive layer 220 may be electrically coupled to the via 212 and the first terminal 228 of the electrical component 226 because the via 212 makes electrical contact with the first electrically-conductive layer 220 disposed over paper layer 112. Similarly, the second electrically-conductive layer 222 may be electrically coupled to the via 218 and the second terminal 230 of the electrical component 226 because the via 218 makes electrical contact with the second electrically-conductive layer 222 disposed over paper layer 112. Although a two-terminal electrical component 226 is shown, it may be contemplated that electrical component 226 may have fewer or additional terminals. For instance, if electrical component 226 has three terminals, the third terminal may be electrically coupled to a third electrically-conductive layer that may be electrically coupled to a third via, such that the third electrically-conductive layer may be distinct from the first electrically-conductive layer 220 and the second electrically-conductive layer 222, and such that the third via may be distinct from vias 212, 218. Such a three-terminal electrical component is described below with respect to FIG. 6 and FIG. 7.

The electrically-conductive material used to fill via holes 212 and 218 may be the same or different material as the electrically-conductive material disposed over paper layer 112 to form the first electrically-conductive layer 220 and the second electrically-conductive layer 222. If additional paper layers 114, 116 are disposed on the side of the paper layer 112 opposite the first electrically-conductive layer 220 and second electrically-conductive layer 222, the electrically-conductive material may fill via holes 208, 210 and be electrically coupled to the first electrically-conductive layer 220 with via 212. Similarly, the electrically-conductive material may fill via holes 214, 216 and be electrically coupled to the second electrically-conductive layer 222 with via 218. If needed, the decorative paper layer 110 may be disposed between the electrical component and the insulating layer 108.

The paper layer 112 and the insulating layer 108 encapsulate the first electrically-conductive layer 220, the second electrically-conductive layer 222, and the electrical component 226 within the laminate 200. Specifically, after the layers described above undergo the high pressure lamination process, the resin that may be impregnated in the paper layer 112 consolidates the first electrically-conductive layer 220, the second electrically-conductive layer 222, and the electrical component 226 into a continuous resin structure, thereby forming the laminate 232.

Figure 3:
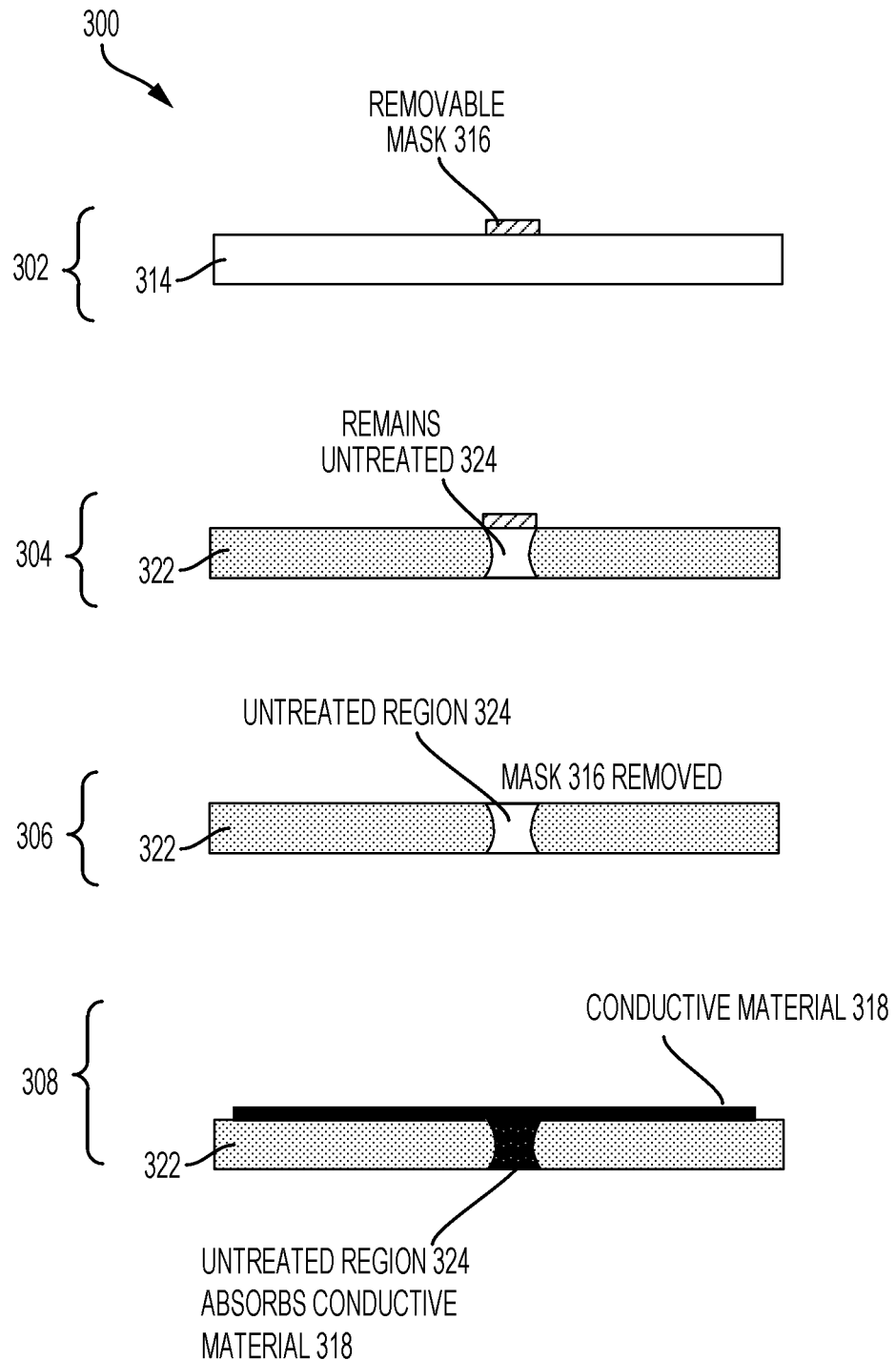
FIG. 3 generally illustrates example operations for forming an electrical via between layers in a laminate using a masking technique.

FIG. 3 illustrates an example operation 300 for forming an electrical via, such as vias 212, 218 of FIG. 2 between paper layers in a laminate using a masking technique. A paper layer for a laminate including an electrical component may be prepared with a sheet of untreated kraft paper 314 (e.g., paper layer 112 of FIG. 2) and partially covered with a removable mask 316 on one side of untreated paper sheet 314 at a location of a desired electrical connection through the paper 314 at operation 302.

A resin-treating operation 304 impregnates the kraft paper 314 with a resin to form resin-treated paper 322. The mask 316 protects a portion 324 of the resin-treated kraft paper 322 during the resin-treating operation 304 and the portion 324 does not become impregnated with the resin. A removing operation 306 removes the mask 316, exposing the untreated region 324 of the resin-treated kraft paper 322.

A disposing operation 308 disposes electrically-conductive material (e.g., the first electrically-conductive material 318) onto the untreated region 324 of the resin-treated kraft paper 322. The electrically-conductive material saturates untreated region 324, but does not saturate the resin-treated region of kraft paper 314, thereby allowing for electrical conductivity through the paper 314.

Figure 4:
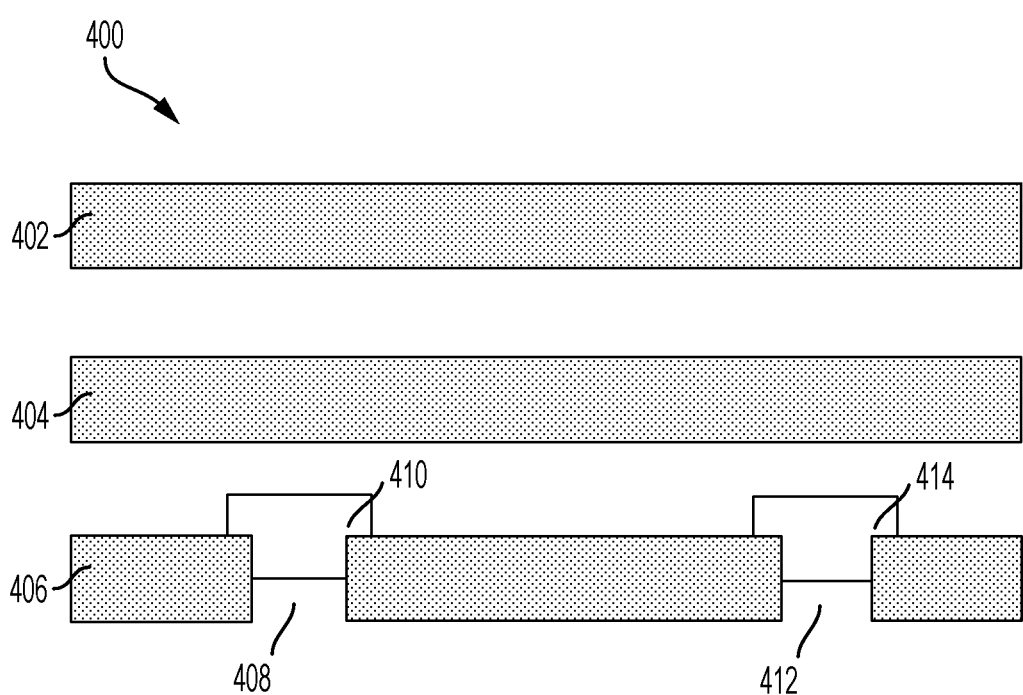
FIG. 4 generally illustrates example operations for forming an electrical via between layers in a laminate using a hole cutting technique.

FIG. 4 illustrates an example operation 400 for forming an electrical via between layers in a laminate using a hole cutting technique. A hole forming operation 400 forms a via hole in a layer of a laminate. For example, hole forming operation 400 may form via holes 408, 412 in layer 406. With reference to FIG. 2, vias 408, 412 may be vias 212, 218, respectively. Layer 402 may be an insulating layer 108, layer 404 may be decorative paper layer 110, and layer 406 may be paper layer 112. The material 410 disposed on layer 406 may be electrically-conductive material to form the first electrically-conductive layer 220. The material 414 disposed on layer 406 may be electrically-conductive material to form the second electrically-conductive layer 222. An electrically-conductive material may fill via hole 408 to electrically couple to material 410, once a lamination process is performed. Similarly, an electrically-conductive material may fill via 412 to electrically couple to material 414 once a lamination process is performed.

Figure 5:
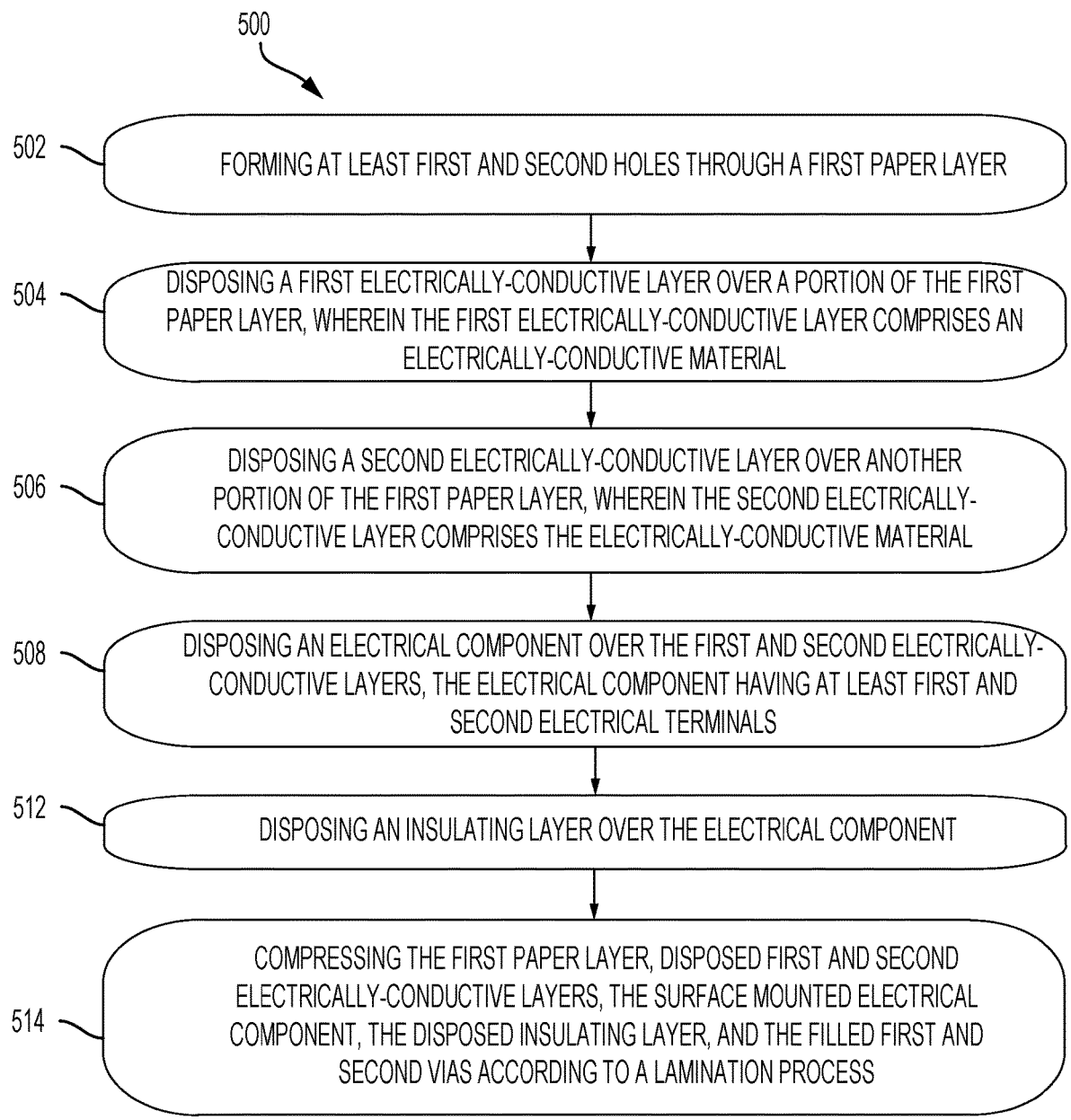
FIG. 5 shows a flowchart for manufacturing a laminate having an integrated electrical component disposed on multiple layers within the laminate.

FIG. 5 shows a flowchart for manufacturing a laminate having an integrated electrical component disposed within the laminate according to one embodiment. The method 500 may be implemented, in whole or in part, by cutting, disposing and high pressure lamination process system(s), implemented by one or more processors, sensors, and/or computer-executable instructions stored on non-transitory computer-readable medium or media.

The method 500 may begin by forming first and second via holes through a first paper layer (block 502). With reference to FIG. 2, the method 500 may form a hole or via that may be formed or cut through the entire paper layer. For example, method 500 may form via holes 212, 218 through paper layer 112. If the laminate 200 requires additional paper layers, method 500 may form via holes 210, 216 and vias 208, 214 on additional paper layers 114, 116, respectively. The vias described may be formed, cut through, or punched through, such as by a mechanical device or a laser, such that upon stacking paper layers on top of each other, the vias traverse each other. For example, via holes 208, 210, and 212 are vertically aligned with each other and via holes are vertically aligned with 214, 216, and 218 when paper layers 112-116 in row 204 are stacked on top of each other. As such, vias of one paper layer may be vertically aligned with vias of another paper layer.

Method 500 proceeds by disposing a first electrically-conductive layer over a portion of the first paper layer, the first electrically-conductive layer including an electrically-conductive material (block 504). With reference to FIG. 2, method 500 may dispose an electrically-conductive material over a portion of the paper layer 112 to form a first electrically-conductive layer 220. In this step, the first via hole is typically also filled. Similarly, method 500 proceeds by disposing a second electrically-conductive layer over another portion of the first paper layer, the second electrically-conductive layer including the electrically-conductive material (block 506). In this step, the second via hole can be filled. In blocks 504 and 506, with reference to FIG. 2, method 500 may dispose an electrically-conductive material over a portion of the paper layer 112 to form a first electrically-conductive layer 220 and over another portion of the paper layer 112 to form a second electrically-conductive layer 222. The electrically-conductive materials may be disposed in any shape, size, and may even form an outline of an aesthetic design. Disposing the electrically-conductive material may involve disposing electrically-conductive material over top of and into one or more via holes. Electrically-conductive materials suitable for use include any material which can be disposed upon paper, particularly resin-impregnated paper, and which may be electrically conductive. Suitable electrically-conductive materials include metals, alloys, and electrically-conductive inks. Electrically-conductive inks are commercially available from a number of sources and can be prepared using a number of known methods. Particularly preferred electrically-conductive inks suitable for use in various preferred embodiments of the present disclosure include silver and/or electrically-conductive carbon particles. Method 500 may dispose additional paper layers 114, 116 on the side of the paper layer 112 opposite the first electrically-conductive layer 220 and the second electrically-conductive layer 222. Alternatively, additional paper layers 114, 116 may be disposed on the same side of the paper layer 112 as the first electrically-conductive layer 220 and the second electrically-conductive layer 222.

Method 500 proceeds by disposing (e.g., surface mounting, affixing with an adhesive, affixing without an adhesive) an electrical component over the first and second electrically-conductive layers, the electrical component having a first and second electrical terminals (block 508). With reference to FIG. 2, method 500 may dispose electrical component 226 over the first electrically-conductive layer 220 and the second electrically-conductive layer 222. Because of the disposing step, the first terminal 228 of the electrical component 226 may be electrically coupled to the first electrically-conductive layer 220, and the second terminal 230 of the electrical component 226 may be electrically coupled to the second electrically-conductive layer 222.

Method 500 proceeds by filling the first and second via holes with an electrically-conductive material (block 510). With reference to FIG. 2, by filling the vias 212, 218 with the electrically-conductive material, the first electrically-conductive layer 220 may be electrically coupled to the via 212 and the first terminal 228 of the electrical component 226 because the via 212 makes electrical contact with the first electrically-conductive layer 220 disposed over paper layer 112 after a lamination process is performed. Similarly, the second electrically-conductive layer 222 may be electrically coupled to the via 218 and the second terminal 230 of the electrical component 226 because the via 218 makes electrical contact with the second electrically-conductive layer 222 disposed over paper layer 112 after a lamination process is formed. The electrically-conductive material used to fill via holes 212 and 218 may be the same or different material as the electrically-conductive material disposed over paper layer 112 to form the first electrically-conductive layer 220 and the second electrically-conductive layer 222.

Method 500 proceeds by disposing an insulating layer over the electrical component (block 512). With reference to FIG. 2, the paper layer 112 and the insulating layer 108 encapsulate the first electrically-conductive layer 220, the second electrically-conductive layer 222, and the electrical component 226 within the laminate 200. Specifically, after layers described above undergo the high pressure lamination process, the resin that may have impregnated the paper layer 112 consolidates the first electrically-conductive layer 220, the second electrically-conductive layer 222, and the electrical component 226 into a continuous resin structure, thereby forming the laminate 232. Lastly, method 500 proceeds by compressing the first paper layer, disposed first and second electrically-conductive layers, the disposed electrical component, the disposed insulating layer, and the filled first and second vias according to a lamination process, thereby encapsulating with the first paper layer, the first electrically-conductive layer, the second electrically-conductive layer, and the electrical component within the laminate (block 514).

By using vias, the disclosed laminate advantageously utilizes different layers to dispose an integrated electrical component within the laminate 200. In addition, because the paper layer 112 and the insulating layer 108 encapsulate the first electrically-conductive layer 220, the second electrically-conductive layer 222, and the electrical component 226 within the laminate 200, the integrated electrical component may be protected during usage of the laminate 200.

In addition to the advantages listed above, further advantages can be realized with additional structural modifications to the laminate 200. For instance, in order to encapsulate the first electrically-conductive layer 220, the second electrically-conductive layer 222, and the electrical component 226 into a continuous resin structure, rather than impregnating the paper layer 112 with a resin material, a glue film layer impregnated with a resin material may be disposed between untreated paper layer 112 and the insulating layer 108. Similarly, if decorative paper layer 110 is needed, the glue film layer impregnated with a resin material may be disposed between the paper layer 112 and the decorative paper layer 110. After undergoing the high pressure lamination process, the resin material from the glue film layer can saturate untreated paper, such as untreated paper layer 112, untreated decorative paper layer 110, and insulating layer 108, to encapsulate the first electrically-conductive layer 220, the second electrically-conductive layer 222, and the electrical component 226 into a continuous resin structure.

Although the laminate 200 as illustrated includes paper layer 112 and optional paper layers 114, 116, optional decorative paper layer 110, and an insulating layer 108, it should be understood that the present disclosure is not limited to the precise configuration shown. For instance, additional paper layers may be stacked below optional paper layer 116. Such additional paper layers may provide space for disposing additional electrical components and making any interconnections with the electrical component 226 within the laminate structure.

Figure 6:
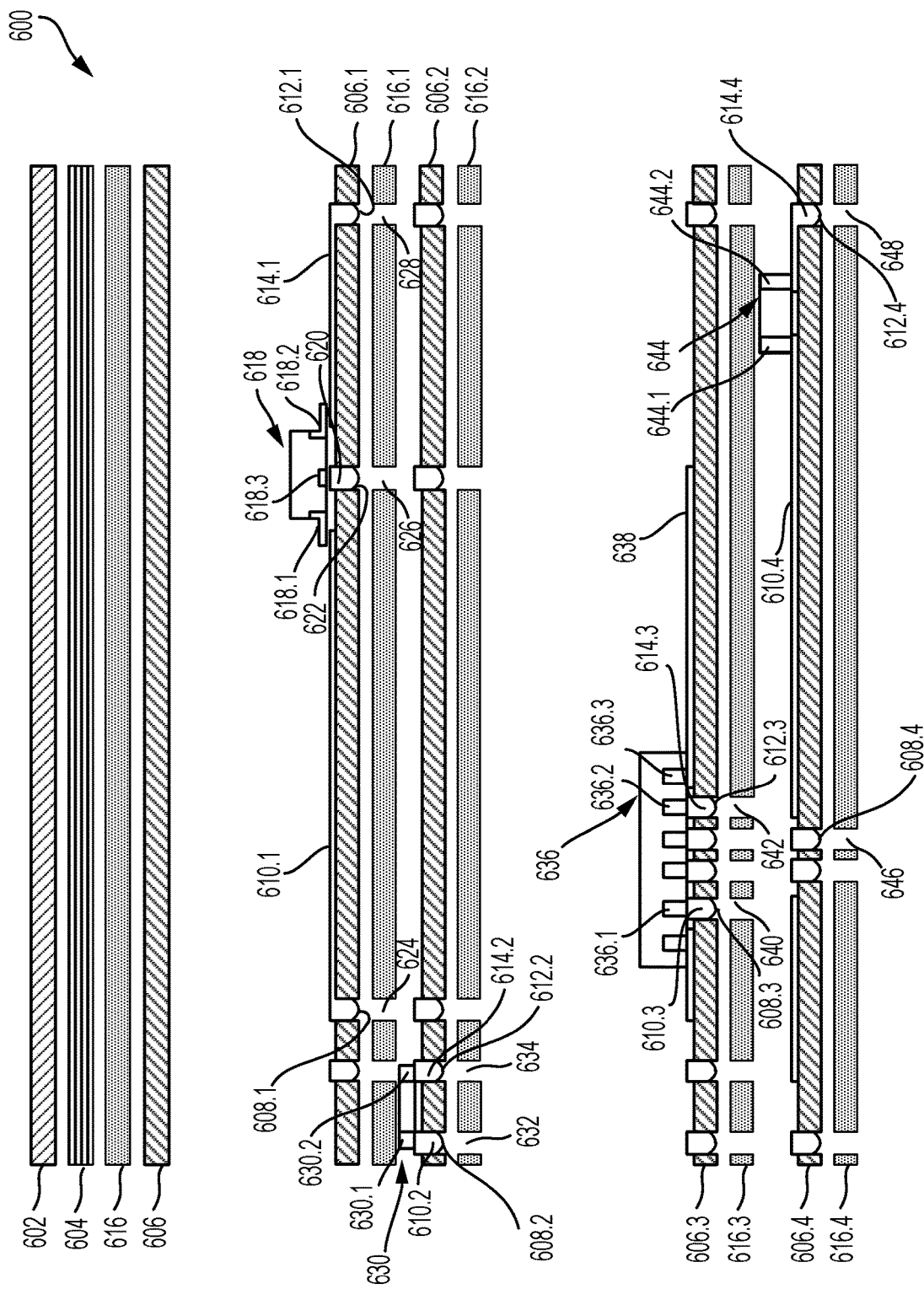
FIG. 6 shows an example of a laminate having one or more integrated electrical components disposed on multiple layers within the laminate.

For example, FIG. 6 shows an example of a laminate 600 having one or more integrated electrical components within the laminate according to one embodiment. The laminate 600 may include any one or more of transistor 618, resistor 630, an integrated circuit 636, capacitor 644, any other suitable electrical component integrated within the laminate 600, or any combination thereof. As such, the electrical components may have any number of electrical terminals. The laminate 600 as shown does not require paper layer 606 (e.g., paper layers 606.1, 606.2, 606.3, and/or 606.4) to be impregnated with a resin material. Instead, in order to encapsulate each of the aforementioned electrical components, a glue film layer 616 (e.g., 616.1, 616.2, 616.3, and/or 616.4) impregnated with resin material may be disposed between each of the untreated paper layers 606.1, 606.2, 606.3, and/or 606.4 and the insulating layer 602. Similarly, if decorative paper layer 604 is needed, the glue film layer 616.1, 616.2, 616.3, and/or 616.4 impregnated with resin material may be disposed between the untreated paper layers 606.1, 606.2, 606.3, and/or 606.4 and the decorative paper layer 604.

For 3-terminal transistor 618, as shown, first electrically-conductive layer 610.1 may be electrically coupled to first via 608.1 (when filled with electrically-conductive material) and the first electrical terminal 618.1 of transistor 618, second electrically-conductive layer 614.1 may be electrically coupled to second via 612.1 (when filled with electrically-conductive material) and the second electrical terminal 618.2 of transistor 618, and a third electrically-conductive layer 620 may be electrically coupled to third via 622 (when filled with electrically-conductive material) and the third electrical terminal 618.3 of transistor 618. As such, untreated paper layer 606.1 may include more than two via holes. Glue film layer 616.1 may have via holes 624, 626, and 628 that traverse via holes 608.1, 622, and 612.1 of untreated paper layer 606.1 such that electrically-conductive material may electrically couple 3-terminal transistor 618 to other electrically-conductive layers or electrical components within the laminate 600, such as resistor 630.

For 2-terminal resistor 630, as shown, first electrically-conductive layer 610.2 may be electrically coupled to first via 608.2 (when filled with electrically-conductive material) and the first electrical terminal 630.1 of resistor 630, and second electrically-conductive layer 614.2 may be electrically coupled to second via 612.2 (when filled with electrically-conductive material) and the second electrical terminal 630.2 of resistor 630. Glue film layer 616.2 may have via holes 632 and 634 that traverse via holes 608.2 and 612.2 of untreated paper layer 606.2 such that electrically-conductive material may electrically couple 2-terminal resistor 630 to other electrical components or electrically-conductive layers within the laminate 600 after a lamination process is performed.

For multi-terminal integrated circuit 636 (e.g., microprocessor), as shown, first electrically-conductive layer 610.3 may be electrically coupled to first via 608.3 (after being filled with electrically-conductive material and a lamination process is performed) and the first electrical terminal 636.1 of integrated circuit 636, and second electrically-conductive layer 614.3 may be electrically coupled to second via 612.3 (after being filled with electrically-conductive material and a lamination process is performed) and the second electrical terminal 630.2 of integrated circuit 636. A third electrical terminal, such as 636.3, may be electrically coupled to a third electrically-conductive layer 638. The third electrically-conductive layer 638 may serve to electrically couple third electrical terminal 636.3 to other terminals of electrical components, such as third electrical terminal 618.3 of transistor 618. Glue film layer 616.3 may have via holes 640 and 642 that substantially aligned via holes 608.3 and 612.3 of untreated paper layer 606.3 such that electrically-conductive material may electrically couple multi-terminal integrated circuit 636 to other electrical components or electrically-conductive layers within the laminate 600 after a lamination process is performed.

For 2-terminal capacitor 644, as shown, first electrically-conductive layer 610.4 may be electrically coupled to first via 608.4 and the first electrical terminal 644.1 of capacitor 644, and second electrically-conductive layer 614.4 may be electrically coupled to second via 612.4 and the second electrical terminal 644.2 of capacitor 644. Glue film layer 616.4 may have via holes 646 and 648 that traverse via holes 608.4 and 612.4 of untreated paper layer 606.4 such that electrically-conductive material may electrically couple 2-terminal capacitor 644 to other electrical components or electrically-conductive layers within the laminate 600 after the vias are filled with electrically-conductive material and a lamination process is performed.

The untreated paper layer 606 (e.g., 606.1, 606.2, 606.3, and/or 606.4) and the insulating layer 602 may encapsulate the first electrically-conductive layer 610 (e.g., 610.1, 610.2, 610.3, and/or 610.4), the second electrically-conductive layer 614.4 (e.g., 614.1, 614.2, 614.3, and/or 614.4), and the electrical component (e.g., 618, 630, 636, and/or 644) within the laminate 600.

Figure 7:
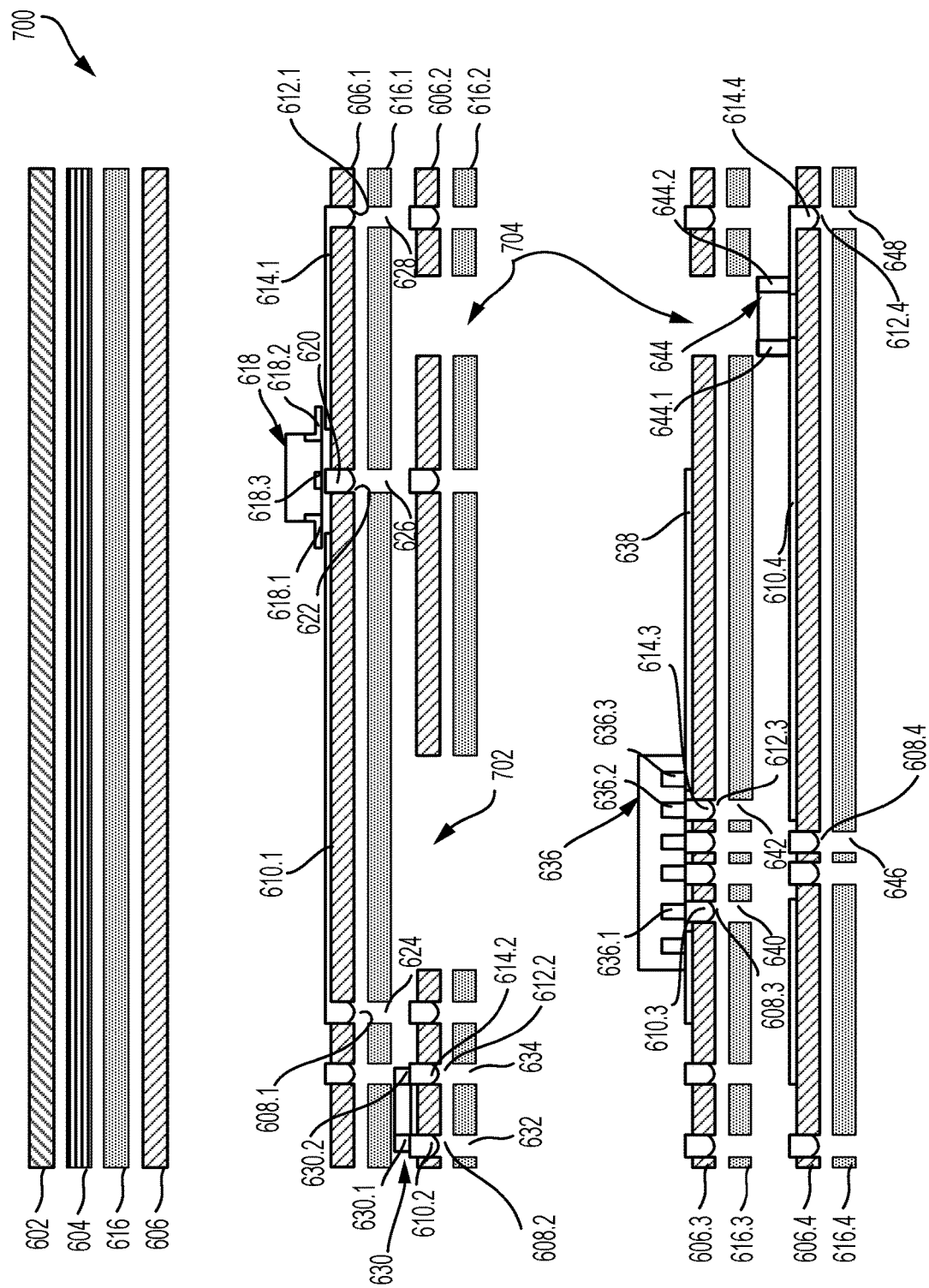
FIG. 7 shows an example of a laminate having one or more integrated electrical components disposed on multiple layers within the laminate.

FIG. 7 shows another example of a laminate 700 having one or more integrated electrical components within the laminate according to one embodiment. The laminate 600 may include any one or more of transistor 618, resistor 630, an integrated circuit 636, capacitor 644, or any other suitable electrical component integrated within the laminate 600 as shown in FIG. 6. However, in contrast to FIG. 6, such laminate 700 may include one or more cutouts, such as cutouts 702 and/or 704, for the one or more integrated electrical components to traverse through the cutout. Generally, the cutout may be formed in any one or more paper layer (e.g., second paper layer) disposed between the electrical component and the insulating layer 602. For instance, as shown, cutout 702 may be formed in glue film layer 616.2 and untreated paper layer 606.2 for integrated circuit 636 to traverse through the cutout. As another example, for bulkier electrical components, cutout 704 may be formed in glue film layer 616.3, untreated paper layer 606.3, glue film layer 616.2, and untreated paper layer 606.2 for capacitor 644 to traverse through the cutout. It is contemplated that any number of glue film layers and untreated paper layers will be used to form the cutout, such that all or part of the electrical component traverses through the cutout. For example, if resistor 630 requires traversal of 3.43 mm vertically, a total of 9 layers comprising several untreated paper layers and glue film layers, having a cutout traversing the layers, may encapsulate resistor 630. Similarly, if the bulkier capacitor 644 requires traversal of 14.29 mm vertically, 36 layers comprising several untreated paper layers and glue film layers, having a cutout traversing the layers, may encapsulate capacitor 644. Various thickness of electrical components, and various number of layers, each of which may be of varying thickness with varying amounts of impregnated resin to encapsulate the electrical components after undergoing a high pressure lamination process, are contemplated herein.

As used herein, the singular terms "a" and "the" are synonymous and used interchangeably with "one or more" and "at least one," unless the language and/or context clearly indicates otherwise. Accordingly, for example, reference to "a paper layer" or "the paper layer" herein or in the appended claims can refer to a single paper layer or more than one paper layer. Additionally, all numerical values, unless otherwise specifically noted, are understood to be modified by the word "about."

For simplicity and clarity of illustration, elements in the figures are not necessarily to scale, and the same reference numbers in different figures denote the same elements. For clarity of the drawing, layers and electrically-conductive materials may be shown as having generally straight line edges and precise angular corners. However, those skilled in the art understand that the edges need not be straight lines and the corners need not be precise angles.

Certain terminology is used in the following description for convenience only and is not limiting. Ordinal designations used herein and an it appended claims, such as "first", "second", "third", etc., are solely for the purpose of distinguishing separate, multiple, similar elements (e.g., a first paper layer and a second paper layer), and do not import any specific ordering or spatial limitations unless otherwise required by context.

The applications and benefits of the systems, methods and techniques described herein are not limited to only the above examples. Many other applications and benefits are possible by using the systems, methods and techniques described herein.

Moreover, although the foregoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed:

1. A laminate having an integrated electrical component disposed within the laminate, the laminate comprising:
   a first paper layer;
   a first electrically-conductive layer comprising an electrically-conductive material, the first electrically-conductive layer being disposed over a portion of the first paper layer;
   a second electrically-conductive layer comprising the electrically-conductive material, the second electrically-conductive layer being disposed over another portion of the first paper layer;
   the electrical component disposed over the first and second electrically-conductive layers, the electrical component having at least first and second electrical terminals;
   an insulating layer disposed over the electrical component, and
   wherein the first paper layer and the insulating layer encapsulate the first electrically-conductive layer, the second electrically-conductive layer, and the electrical component within the laminate.

2. The laminate of claim 1, further comprising:
   at least a second paper layer disposed between the electrical component and the insulating layer, the second paper layer comprising a cutout for the electrical component to traverse through the second paper layer.

3. The laminate of claim 1, wherein the insulating layer is one of at least a resin-impregnated decorative paper or a treated overlay.

4. The laminate of claim 3, further comprising:
   a decorative paper layer, the decorative paper layer being disposed between the electrical component and the insulating layer.

5. The laminate of claim 1, wherein the first paper layer is impregnated with a resin material.

6. The laminate of claim 5, wherein the resin material comprises a phenolic resin.

7. The laminate of claim 1, wherein the first electrically-conductive layer or the second electrically-conductive layer comprises silver particles.

8. The laminate of claim 1, further comprising:
   at least a third paper layer disposed on a side of the first paper layer opposite the first and second electrically-conductive layers.

9. The laminate of claim 1, wherein the electrical component is at least one of a capacitor, resistor, transistor, or an integrated electrical component.

10. The laminate of claim 1, wherein the electrically-conductive material comprises a particulate, electrically-conductive material, a binder, and a microcrystalline cellulose component.

11. The laminate of claim 1, wherein the first electrically-conductive layer and the second electrically-conductive layer are disposed onto the first paper layer.

12. A solid surface comprising the laminate according to claim 1 disposed on a supporting substrate.

13. A high pressure decorative laminate having an integrated electrical component disposed within the laminate, the laminate comprising:
   a first paper layer;
   a first electrically-conductive layer comprising an electrically-conductive material, the first electrically-conductive layer being disposed over a portion of the first paper layer;
   a second electrically-conductive layer comprising the electrically-conductive material, the second electrically-conductive layer being disposed over another portion of the first paper layer;
   the electrical component disposed over the first and second electrically-conductive layers, the electrical component having at least first and second electrical terminals, wherein the electrical component is at least one of a capacitor, resistor, transistor, or an integrated electrical component;
   an insulating layer disposed over the electrical component, wherein the insulating layer is one of at least a resin-impregnated decorative paper or a treated overlay, and
   wherein the first paper layer and the insulating layer encapsulate the first electrically-conductive layer, the second electrically-conductive layer, and the electrical component within the laminate.

14. The high pressure decorative laminate of claim 13, further comprising:
   at least a second paper layer disposed between the electrical component and the insulating layer, the second paper layer comprising a cutout for the electrical component to traverse through the second paper layer.

15. The high pressure decorative laminate of claim 13, further comprising:
   at least a third paper layer disposed on a side of the first paper layer opposite the first and second electrically-conductive layers.

16. The high pressure decorative laminate of claim 13, further comprising:
   a decorative paper layer, the decorative paper layer being disposed between the electrical component and the insulating layer.

17. The high pressure decorative laminate of claim 13, wherein at least one glue film layer impregnated with a resin material is disposed between the first paper layer and the decorative paper layer.

18. The laminate of claim 13, wherein the electrically-conductive material comprises a particulate, electrically-conductive material, a binder, and a microcrystalline cellulose component.

19. The laminate of claim 13, wherein the first electrically-conductive layer and the second electrically-conductive layer are disposed onto the first paper layer.

* * * * *